US010270357B2

(12) United States Patent
Aoshima (10) Patent No.: US 10,270,357 B2
(45) Date of Patent: Apr. 23, 2019

(54) PRINTED WIRING BOARD, CIRCUIT BOARD, AND CONTROL UNIT (71) Applicant: Mitsubishi Electric Corporation, Tokyo (JP)

(72) Inventor: Takuma Aoshima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 238 days.

(21) Appl. No.: 15/509,308

(22) PCT Filed: Dec. 22, 2014

(86) PCT No.: PCT/JP2014/083938
§ 371 (c)(1),
(2) Date: Mar. 7, 2017

(87) PCT Pub. No.: WO2016/103326
PCT Pub. Date: Jun. 30, 2016

(65) Prior Publication Data
US 2017/0288495 A1 Oct. 5, 2017

(51) Int. Cl.
*H02M 7/00* (2006.01)
*H05K 1/02* (2006.01)
(Continued)

(52) U.S. Cl.
CPC ............. *H02M 7/003* (2013.01); *F24F 11/74* (2018.01); *F24F 13/1426* (2013.01);
(Continued)

(58) Field of Classification Search
CPC ........ H02M 1/44; H02M 7/003; H02M 7/066; H02M 7/106; H02K 5/225; H05K 1/02; H05K 1/029; H05K 1/181
See application file for complete search history.

(56) References Cited

U.S. PATENT DOCUMENTS 5,675,223 A * 10/1997 Yoshizawa ............ H02M 7/003
318/139
6,445,596 B1 * 9/2002 Mihara .................... H05B 6/66
363/21.01
(Continued)

FOREIGN PATENT DOCUMENTS

DE 10 2011 003 833 A1 8/2012
EP 1 703 780 A1 9/2006
(Continued)

OTHER PUBLICATIONS

Office action dated Oct. 11, 2017 corresponding to Australian patent application No. 2014415156.
(Continued)

*Primary Examiner* — Yusef A Ahmed
(74) *Attorney, Agent, or Firm* — Posz Law Group, PLC (57) ABSTRACT A printed wiring board includes a primary circuit that receives power supply of a high voltage from a high power source; a pattern for a low voltage circuit that is used when a low voltage component used for a low voltage lower than the high voltage and a power supply terminal block that receives power supply of the low voltage from a low power source are provided; a pattern for a common circuit that is used when a high voltage component used for the high voltage and the low voltage that insulates the pattern for the primary circuit from the pattern for the common circuit; a first insulator which insulates the pattern of the primary circuit from the pattern of the common circuit; and a second insulator that insulates the pattern for the common circuit from the pattern for the low voltage circuit.

10 Claims, 9 Drawing Sheets (51) Int. Cl.
*F24F 13/14* (2006.01)
*H02K 5/22* (2006.01)
*F24F 11/74* (2018.01)
*H02M 7/10* (2006.01)
*H05K 1/18* (2006.01)

(52) U.S. Cl.
CPC .............. *H02K 5/225* (2013.01); *H05K 1/02* (2013.01); *H05K 1/029* (2013.01); *H05K 1/0262* (2013.01); *H05K 1/0269* (2013.01); *F24F 2013/1433* (2013.01); *H02M 7/106* (2013.01); *H05K 1/181* (2013.01); *H05K 2201/09936* (2013.01); *H05K 2201/1009* (2013.01); *H05K 2201/10189* (2013.01); *H05K 2201/10363* (2013.01); *H05K 2201/10522* (2013.01); *H05K 2203/173* (2013.01)

(56) References Cited

U.S. PATENT DOCUMENTS

| | | | | |
|---|---|---|---|---|
| 2011/0211980 A1* | 9/2011 | Shibuya | | F04B 39/121 |
| | | | | 417/410.1 |
| 2011/0236235 A1* | 9/2011 | Hattori | | B60H 1/00428 |
| | | | | 417/410.1 |
| 2012/0045353 A1* | 2/2012 | Watanabe | | F04B 35/04 |
| | | | | 417/410.1 |
| 2012/0063187 A1 | 3/2012 | Sato et al. | | |
| 2012/0320645 A1* | 12/2012 | Fujino | | H02M 7/003 |
| | | | | 363/123 |
| 2013/0049550 A1* | 2/2013 | Watanabe | | F04B 39/121 |
| | | | | 310/67 R |
| 2015/0121929 A1* | 5/2015 | Yamada | | H02P 27/06 |
| | | | | 62/238.1 |
| 2018/0069487 A1* | 3/2018 | Hattori | | F04B 39/00 |
| 2018/0076733 A1* | 3/2018 | Hattori | | F04B 35/04 |
| 2018/0138810 A1* | 5/2018 | Hattori | | H02M 7/48 |
| 2018/0281605 A1* | 10/2018 | Sawazaki | | H01L 23/4012 |
| 2018/0294698 A1* | 10/2018 | Mizukami | | H02K 11/33 |

FOREIGN PATENT DOCUMENTS

| | | |
|---|---|---|
| JP | S61-276654 A | 12/1986 |
| JP | S63-281497 A | 11/1988 |
| JP | H02-129759 U | 10/1990 |
| JP | H03-051395 U | 5/1991 |
| JP | H05-284782 A | 10/1993 |
| JP | H07-162109 A | 6/1995 |
| JP | H09-135058 A | 5/1997 |
| JP | 2002-228238 A | 8/2002 |
| JP | 2004-281679 A | 10/2004 |
| JP | 2006-295115 A | 10/2006 |
| JP | 2006-300038 A | 11/2006 |
| JP | 2008-103461 A | 5/2008 |
| JP | 2008-157575 A | 7/2008 |
| JP | 2011-018788 A | 1/2011 |
| JP | 2012-065431 A | 3/2012 |
| JP | 2015-025596 A | 2/2015 |
| WO | 2012/107463 A1 | 8/2012 |

OTHER PUBLICATIONS

International Search Report of the International Searching Authority dated Mar. 24, 2015 for the corresponding international application No. PCT/JP2014/083938 (and English translation).
Extended European Search Report dated Oct. 6, 2016 issued in corresponding EP patent application No. 14897429.8.

* cited by examiner

PRINTED WIRING BOARD, CIRCUIT BOARD, AND CONTROL UNIT

CROSS REFERENCE TO RELATED APPLICATION

This application is a U.S. national stage application of International Patent Application No. PCT/JP2014/083938 filed on Dec. 22, 2014, the disclosure of which is incorporated herein by reference.

TECHNICAL FIELD

The present invention relates to a printed wiring board, a circuit board, and a control unit that include a pattern for a primary circuit for receiving power supplied from a high power source.

BACKGROUND

Patent Literature 1 discloses that a low voltage circuit and a high voltage circuit can be provided on a single printed wiring board with a jumper provided thereon. Also, in the invention disclosed in Patent Literature 2, a power source circuit can be used for a plurality of voltage specifications.

PATENT LITERATURE

Patent Literature 1: Japanese Patent Application Laid-Open No. 2011-18788
Patent Literature 2: Japanese Patent Application Laid-Open No. H7-162109

In the IEC-60335 standard of the International Electrotechnical Commission (IEC), electrical circuits can be divided into circuits having a voltage higher than 42.4 V of which connectable part is assumed as a charging unit and circuits having a voltage equal to or lower than 42.4 V. A circuit having a voltage higher than 42.4 V is referred to as a circuit for a high voltage or as a high voltage circuit, and a circuit having a voltage equal to or lower than 42.4 V is referred to as a circuit for a low voltage or as a low voltage circuit. Further, a voltage higher than 42.4 V is referred to as a high voltage and a voltage equal to or lower than 42.4 V is referred to as a low voltage. The insulation distance necessary for a circuit for a high voltage is defined in the IEC-60335. Patent Literatures 1 and 2 do not disclose a method for realizing a circuit for a high voltage and a circuit for a low voltage on a single printed wiring board.

A ceiling embedded type duct air conditioner includes a control unit controlling the opening/closing of a duct and it feeds air to each room via connected ducts. There are 24-Volt motors and a 240-Volt motors used to drive the dampers that open and close ducts; therefore, the control units used to control the opening/closing of the ducts are divided into two types.

For the control unit for a 24V motor, a modular connector, which is a connector, is used for the connection to the motor; and for the control unit for a 240V motor, a terminal block is used for the connection to the motor. The required insulation distance of the low voltage circuit is different from that of the high voltage circuit. When the modular connector that is the connector for 24 V is used with the high voltage circuit, the insulation distance is insufficient.

Therefore, even when a part of the circuit, such as a motor in a product, is different, it is necessary to exclusively provide a connector for the low voltage and a terminal block for the high voltage. Therefore, when the connector or the terminal block is of a substrate mounting type, it is necessary to provide different printed wiring boards for the low voltage and for the high voltage, which increases the development costs.

Further, when the connector and the terminal block are provided off the printed wiring board, there have been problems in that there is an increased cost of providing a structure for fixing the component placed off the substrate and providing wiring for connecting the component off the substrate to the substrate and also in that the size of the device increases.

SUMMARY

The present invention has been made in consideration of the above problems. An objective of the present invention is to obtain a printed wiring board that can be used in both the case where a low voltage component is mounted thereon and also in the case where a high voltage component is mounted thereon.

In order to solve the problem and achieve the objective, the present invention relates to a printed wiring board that includes: a pattern for a primary circuit that receives a power supply with a high voltage from a high power source; a pattern for a low voltage circuit that is used in a case where a low voltage component used on a low voltage lower than the high voltage and a power supply terminal block that receives power supply of the low voltage from a low power source are provided; a pattern for a common circuit that is used in a case where a high voltage component used for the high voltage is provided and also in a case where the low voltage component is provided; a first insulator that insulates the pattern for the primary circuit from the pattern for the common circuit; and a second insulator that insulates the pattern for the common circuit from the pattern for the low voltage circuit.

A printed wiring board according to the present invention has an effect whereby a printed wiring board can be used in both the case where a low voltage component is mounted thereon and also the case where a high voltage component is mounted thereon.

DETAILED DESCRIPTION

A printed wiring board, a circuit board, and a control unit according to embodiments of the present invention will be described in detail below with reference to the drawings. The present invention is not limited to these embodiments.

First Embodiment

Figure 1:
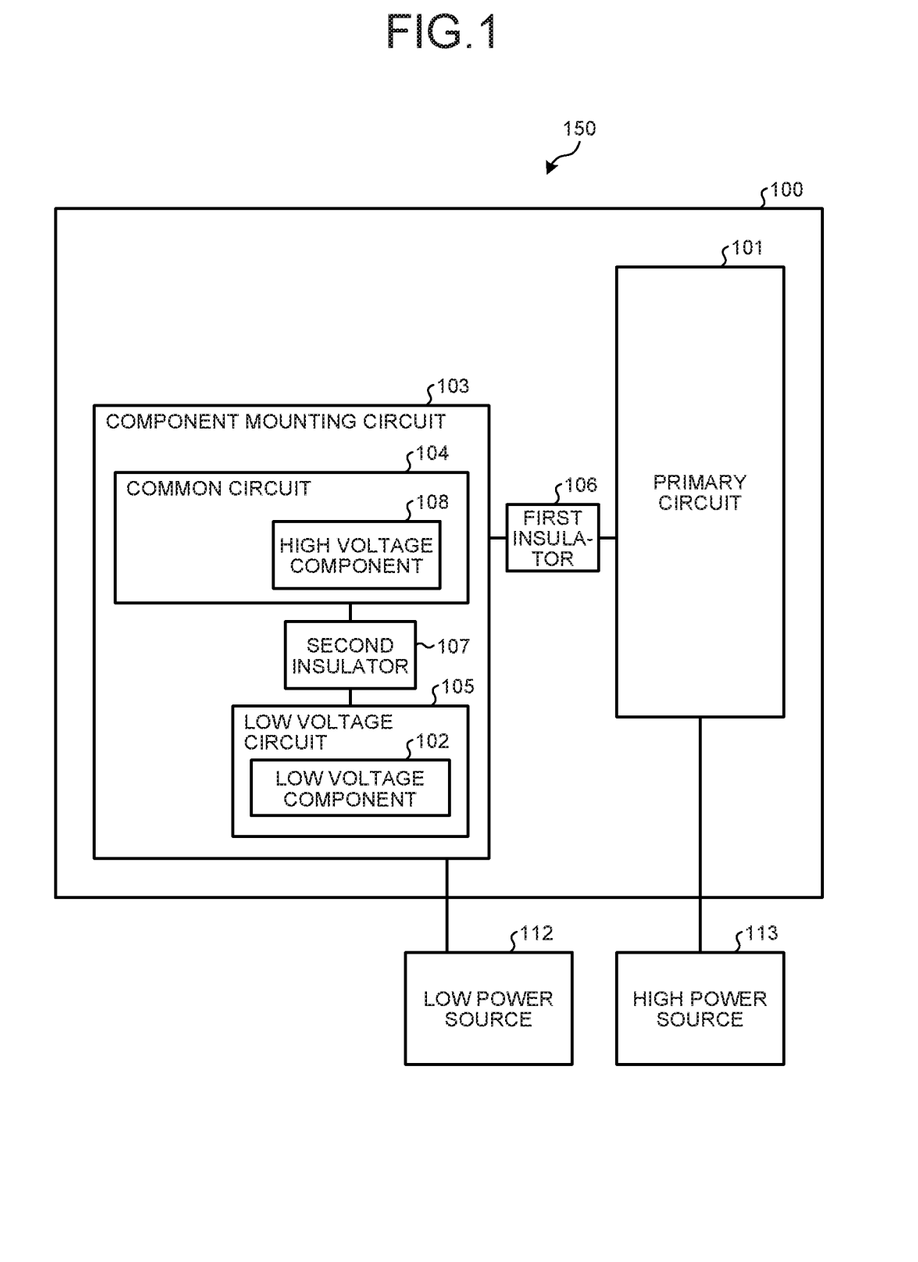
FIG. 1 is a block diagram illustrating a configuration of a circuit board according to a first embodiment of the present invention.

FIG. 1 is a block diagram illustrating a configuration of a circuit board according to a first embodiment of the present invention. A circuit board 150 includes a printed wiring board 100 having a wiring pattern formed thereon. The printed wiring board 100 includes the pattern for a primary circuit 101 that receives power supplied from an external high power source 113 and the pattern for a component mounting circuit 103. A low voltage component 102 or a high voltage component 108 is exclusively mounted on the component mounting circuit 103. A first insulator 106 is provided between the pattern for the primary circuit 101 and the pattern for the component mounting circuit 103. The first insulator 106 has an insulation distance necessary for the voltage value of the power supplied from the high power source 113.

The component mounting circuit 103 includes a low voltage circuit 105 that is used in a case where the low voltage component 102 is mounted thereon and a common circuit 104 that is used when either one of the low voltage component 102 and the high voltage component 108 is mounted thereon.

A second insulator 107 is provided between the low voltage circuit 105 and the common circuit 104. The second insulator 107 has an insulation distance necessary for the voltage value of the power supplied from the primary circuit 101 to the component mounting circuit 103. When the low voltage component is mounted on the component mounting circuit 103, the power is supplied from an external low power source 112 to the low voltage circuit 105.

When the high voltage component is mounted on the component mounting circuit 103, a first jumper is mounted on the first insulator 106, and the primary circuit 101 is connected to the component mounting circuit 103. A high voltage is supplied from the primary circuit 101 to the high voltage component 108. Further, a second jumper is not mounted on the second insulator 107, and the common circuit 104 is insulated from the low voltage circuit 105.

When the low voltage component is mounted on the component mounting circuit 103, the first jumper is not mounted on the first insulator 106, and the primary circuit 101 is insulated from the component mounting circuit 103. Further, the second jumper is mounted on the second insulator 107, and the common circuit 104 is connected to the low voltage circuit 105. A low voltage is supplied from the low voltage circuit 105 to the low voltage component 102.

Figure 2:
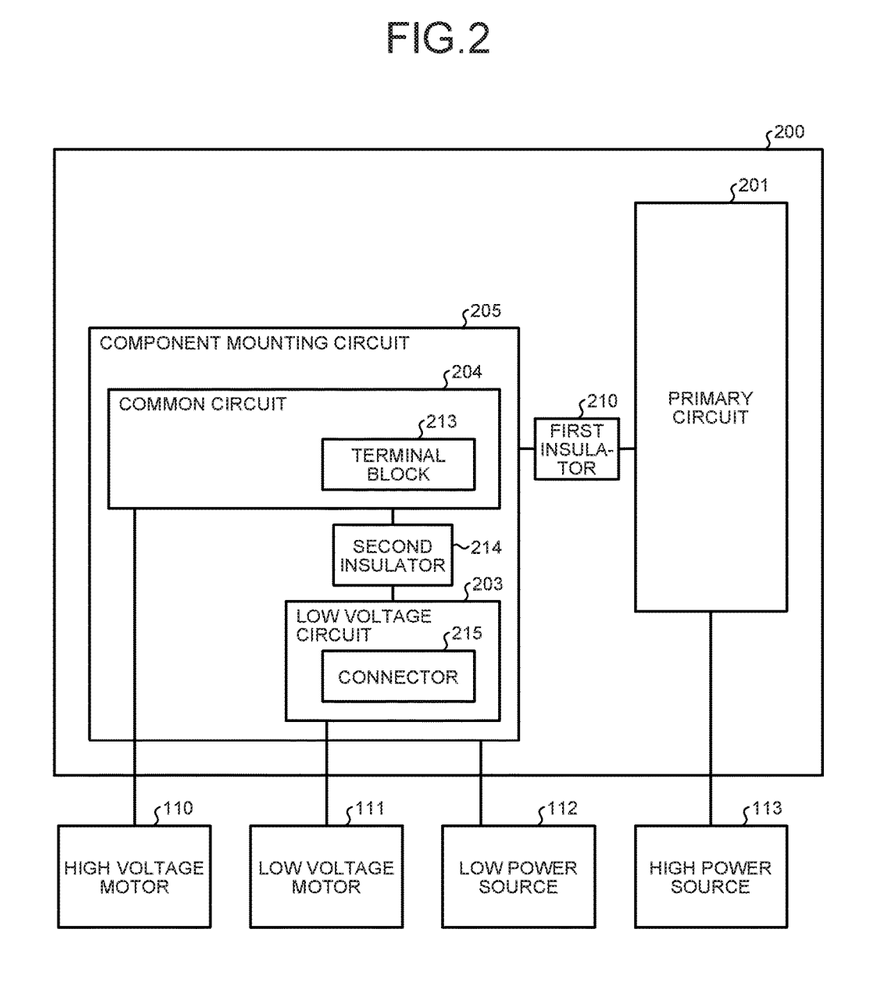
FIG. 2 is a diagram illustrating a configuration of a circuit board for controlling a motor that uses a printed wiring board according to the first embodiment.

FIG. 2 is a diagram illustrating a configuration of a circuit board for controlling a motor that uses a printed wiring board according to the first embodiment. A circuit board 200 has a terminal block 213 that is a high voltage component and that is used to connect to a high voltage motor 110. Also, a connector 215 is a low voltage component and it is used to connect to a low voltage motor 111. A primary circuit 201, a low voltage circuit 203, a common circuit 204, a component mounting circuit 205, a first insulator 210, and a second insulator 214 are respectively similar to the primary circuit 101, the low voltage circuit 105, the common circuit 104, the component mounting circuit 103, the first insulator 106, and the second insulator 107 described in FIG. 1. On the circuit board 200, the connector 215 that is a low voltage component and the terminal block 213 that is a high voltage component are exclusively mounted. However, for convenience of description, a state in which both the connector 215 and the terminal block 213 are mounted is illustrated in FIG. 2.

Figure 3:
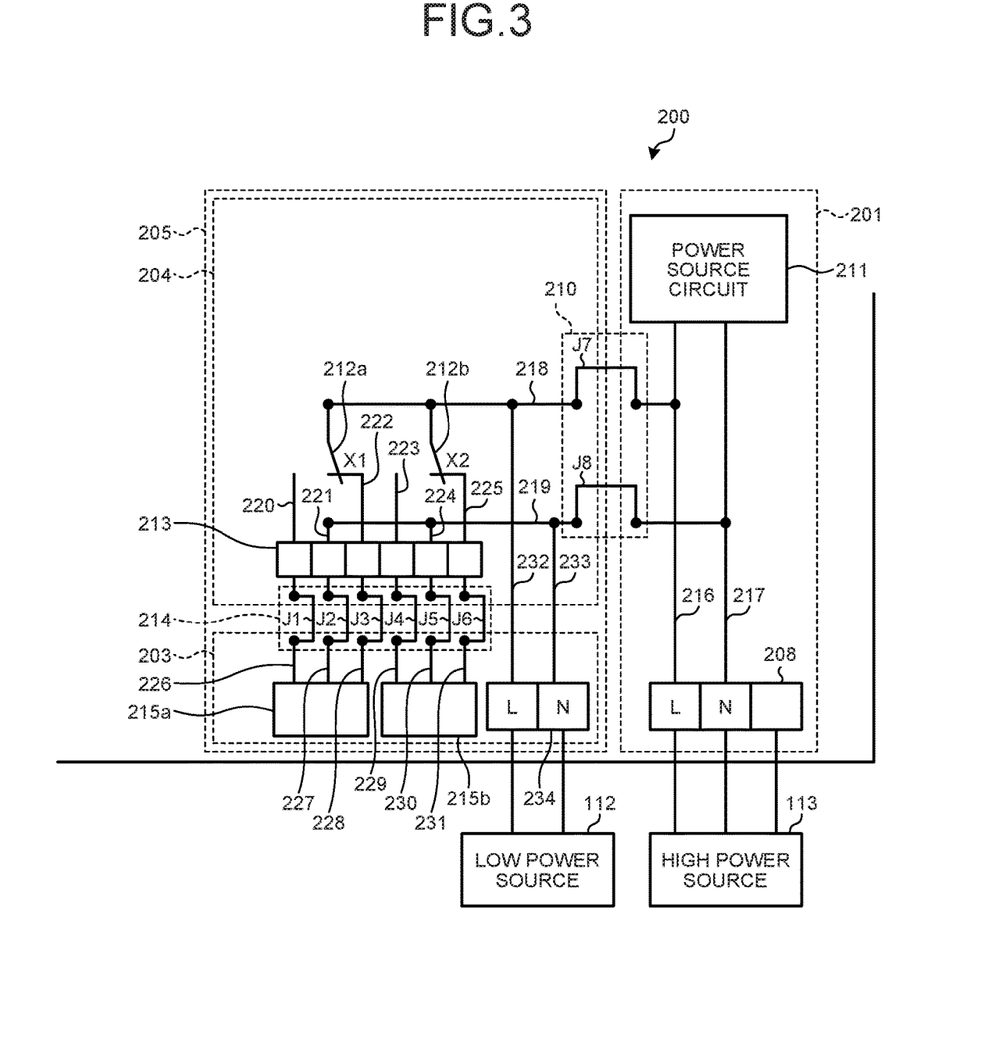
FIG. 3 is a diagram explaining an exemplary circuit structure of the circuit board for controlling the motor that uses a printed wiring board according to the first embodiment.

FIG. 3 is a diagram explaining an exemplary circuit structure of the circuit board for controlling the motor that uses a printed wiring board according to the first embodiment. On the circuit board 200, connectors 215a and 215b, which are low voltage components, and the terminal block 213, which is a high voltage component, are exclusively mounted. However, for convenience of description, a state in which both the connectors 215a and 215b and the terminal block 213 are mounted is illustrated in FIG. 3.

The primary circuit 201 includes a terminal block 208 for receiving power supplied from the high power source 113. When the high power source 113 is a single-phase power source, two wiring routes, which are a live L and a neutral N, supply the power to the terminal block 208. Another terminal of the terminal block 208 other than the live L and the neutral N is grounded. The primary circuit 201 includes a power source circuit 211 for supplying a DC power source to control the device. The DC power source supplied by the power source circuit 211 is used to drive a relay (described later). The power that is supplied from the high power source 113 to the terminal block 208 is supplied to the power source circuit 211 via a live wiring 216 and a neutral wiring 217. Further, the live wiring 216 is connected to the first insulator 210. The neutral wiring 217 is also connected to the first insulator 210. There is also a case where a secondary circuit generated by the power source circuit 211 is provided on the circuit board 200.

The component mounting circuit 205 includes the low voltage circuit 203 that is used only in a case where the low voltage motor 111 is connected and the common circuit 204 that is used when either one of the low voltage motor 111 and the high voltage motor 110 is connected.

The common circuit 204 includes a live wiring 218 and a neutral wiring 219. When a first jumper J7 is mounted on the first insulator 210, the live wiring 218 is connected to the live wiring 216 of the primary circuit 201. When a first jumper J8 is connected to the first insulator 210, the neutral wiring 219 is connected to the neutral wiring 217 of the primary circuit 201.

In a case where it is desired to provide a distance of 5 mm, which is a distance corresponding to reinforcing insulation between the primary circuit 201 and the common circuit 204 by using a lead type jumper as the first jumper J7, the distance corresponding to the reinforcing insulation can be secured by using a 10-mm jumper.

The live wiring 218 is connected to a first relay 212a and a second relay 212b used to switch the motor on/off and to switch forward/reverse. The first relay 212a connects the live wiring 218 either to a first forward wiring 220 or to a first reverse wiring 222. The second relay 212b connects the live wiring 218 either to a second forward wiring 223 or to a second reverse wiring 225. A first return current wiring 221 and a second return current wiring 224 are extended from the neutral wiring 219. The first forward wiring 220, the first return current wiring 221, the first reverse wiring 222, the second forward wiring 223, the second return current wiring 224, and the second reverse wiring 225 are connected to the second insulator 214.

Further, pads for mounting the terminal block 213 thereon are provided on the first forward wiring 220, the first return current wiring 221, the first reverse wiring 222, the second forward wiring 223, the second return current wiring 224, and the second reverse wiring 225. In FIG. 3, the mounting pads are not illustrated because the pads are provided behind the terminal block 213. The terminal block 213 is a substrate mounting type terminal block and it is used to connect the high voltage motor 110. Each interval between the pins of the terminal block 213 has enough distance securely insulated even when used with a high voltage.

The low voltage circuit 203 includes a first forward wiring 226, a first return current wiring 227, a first reverse wiring 228, a second forward wiring 229, a second return current wiring 230 and a second reverse wiring 231. The first forward wiring 226, the first return current wiring 227, the first reverse wiring 228, the second forward wiring 229, the second return current wiring 230, and the second reverse wiring 231 are extended from the second insulator 214. When a second jumper J1 is mounted on the second insulator 214, the first forward wiring 226 is connected to the first forward wiring 220 of the common circuit 204. When a second jumper J2 is mounted on the second insulator 214, the first return current wiring 227 is connected to the first return current wiring 221 of the common circuit 204. When a second jumper J3 is mounted on the second insulator 214, the first reverse wiring 228 is connected to the first reverse wiring 222 of the common circuit 204. When a second jumper J4 is mounted on the second insulator 214, the second forward wiring 229 is connected to the second forward wiring 223 of the common circuit 204. When a second jumper J5 is mounted on the second insulator 214, the second return current wiring 230 is connected to the second return current wiring 224 of the common circuit 204. When a second jumper J6 is mounted on the second insulator 214, the second reverse wiring 231 is connected to the second reverse wiring 225 of the common circuit 204.

When it is necessary to set a distance of 3 mm for functional insulation between the live and the neutral, it is required to perform functional insulation corresponding to the states of the first relay 212a and the second relay 212b at each interval between the second jumpers J1 to J6. When a chip-type jumper having a size of 3216 and 0Ω is used as a jumper, a creepage distance of 1.6 mm can be obtained for each jumper. Therefore, by using a resistance having a size equal to or larger than 3216 as the second jumpers J1 to J6, an insulation distance, which includes both the live side and the neutral side, of equal to or longer than 3.2 mm can be ensured.

The first forward wiring 226, the first return current wiring 227, and the first reverse wiring 228 are connected to the connector 215a for connecting the low voltage motor 111. The second forward wiring 229, the second return current wiring 230, and the second reverse wiring 231 are connected to the connector 215b for connecting to the low voltage motor 111. Because the connectors 215a and 215b are low voltage connectors, the insulation distance is insufficient when the connectors 215a and 215b are used for a high voltage circuit.

The low voltage circuit 203 includes a live wiring 232 and a neutral wiring 233. Pads to mount a terminal block 234 thereon are provided on the live wiring 232 and the neutral wiring 233. In FIG. 3, the mounting pads are not illustrated because the pads are provided behind the terminal block 234. The live wiring 232 is connected to the live wiring 218 of the common circuit 204. The neutral wiring 233 is connected to the neutral wiring 219 of the common circuit 204.

Figure 4:
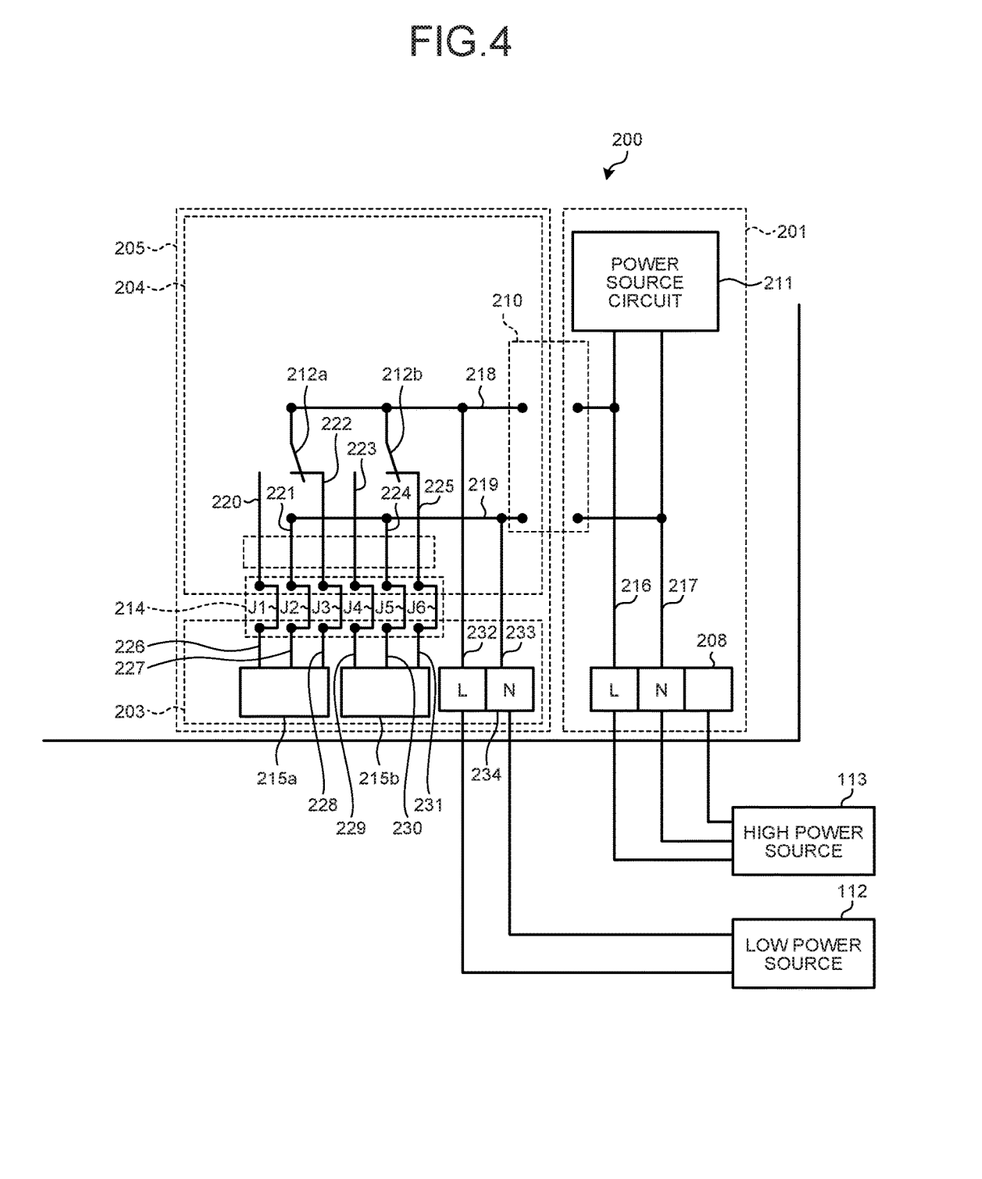
FIG. 4 is a diagram illustrating a configuration of a circuit board for controlling a low voltage motor that uses a printed wiring board according to the first embodiment.

FIG. 4 is a diagram illustrating a configuration of a circuit board for controlling a low voltage motor that uses a printed wiring board according to the first embodiment. On the circuit board 200 for controlling the low voltage motor, the first jumpers J7 and J8 are not mounted on the first insulator 210, and the live wiring 216 of the primary circuit 201 is separated from the live wiring 218 of the common circuit 204. Further, the neutral wiring 217 of the primary circuit 201 is separated from the neutral wiring 219 of the common circuit 204.

Further, the second jumpers J1 to J6 are mounted on the second insulator 214. Accordingly, the first forward wiring 226 of the low voltage circuit 203 is connected to the first forward wiring 220 of the common circuit 204. The first return current wiring 227 of the low voltage circuit 203 is connected to the first return current wiring 221 of the common circuit 204. The first reverse wiring 228 of the low voltage circuit 203 is connected to the first reverse wiring 222 of the common circuit 204. The second forward wiring 229 of the low voltage circuit 203 is connected to the second forward wiring 223 of the common circuit 204. The second return current wiring 230 of the low voltage circuit 203 is connected to the second return current wiring 224 of the common circuit 204. The second reverse wiring 231 of the low voltage circuit 203 is connected to the second reverse wiring 225 of the common circuit 204.

The connectors 215a and 215b are mounted on the low voltage circuit 203. The first forward wiring 226, the first return current wiring 227, and the first reverse wiring 228 connect the connector 215a. The second forward wiring 229, the second return current wiring 230, and the second reverse wiring 231 connect the connector 215b.

Further, the terminal block 234 is mounted on the low voltage circuit 203, and the live wiring 232 is connected to the live wiring 218 of the common circuit 204. Further, the neutral wiring 233 is connected to the neutral wiring 219 of the common circuit 204. The common circuit 204 does not have the terminal block 213 mounted thereon.

The live side of the low voltage supplied from the low power source 112 is supplied from the terminal block 234 to the first relay 212a and the second relay 212b via the live wiring 232 and the live wiring 218. The first relay 212a connects the live wiring 218 to either the first forward wiring 220 or the first reverse wiring 222. When the first relay 212a connects the live wiring 218 to the first forward wiring 220, the power is supplied to a forward terminal of the connector 215a via the second jumper J1 and the first forward wiring 226 of the low voltage circuit 203. When the first relay 212a connects the live wiring 218 to the first reverse wiring 222, the power is supplied to a reverse terminal of the connector 215a via the second jumper J3 and the first reverse wiring 228 of the low voltage circuit 203. The second relay 212b connects the live wiring 218 to either the second forward wiring 223 or the second reverse wiring 225. When the second relay 212b connects the live wiring 218 to the second forward wiring 223, the power is supplied to a forward terminal of the connector 215b via the second jumper J4 and the second forward wiring 229 of the low voltage circuit 203. When the second relay 212b connects the live wiring 218 to the second reverse wiring 225, the power is supplied to a reverse terminal of the connector 215b via the second jumper J6 and the second reverse wiring 231 of the low voltage circuit 203. Additionally, in the first embodiment, the low voltage is 24 V.

The neutral side of the low voltage supplied from the low power source 112 is supplied from the terminal block 234 to the connector 215a via the neutral wiring 233, the first return current wiring 221, the second jumper J2, and the first return current wiring 227. Further, the neutral side of the 24-Volt power supplied from the low power source 112 is supplied from the terminal block 234 to the connector 215b via the neutral wiring 233, the second return current wiring 224, the second jumper J5, and the second return current wiring 230.

Figure 5:
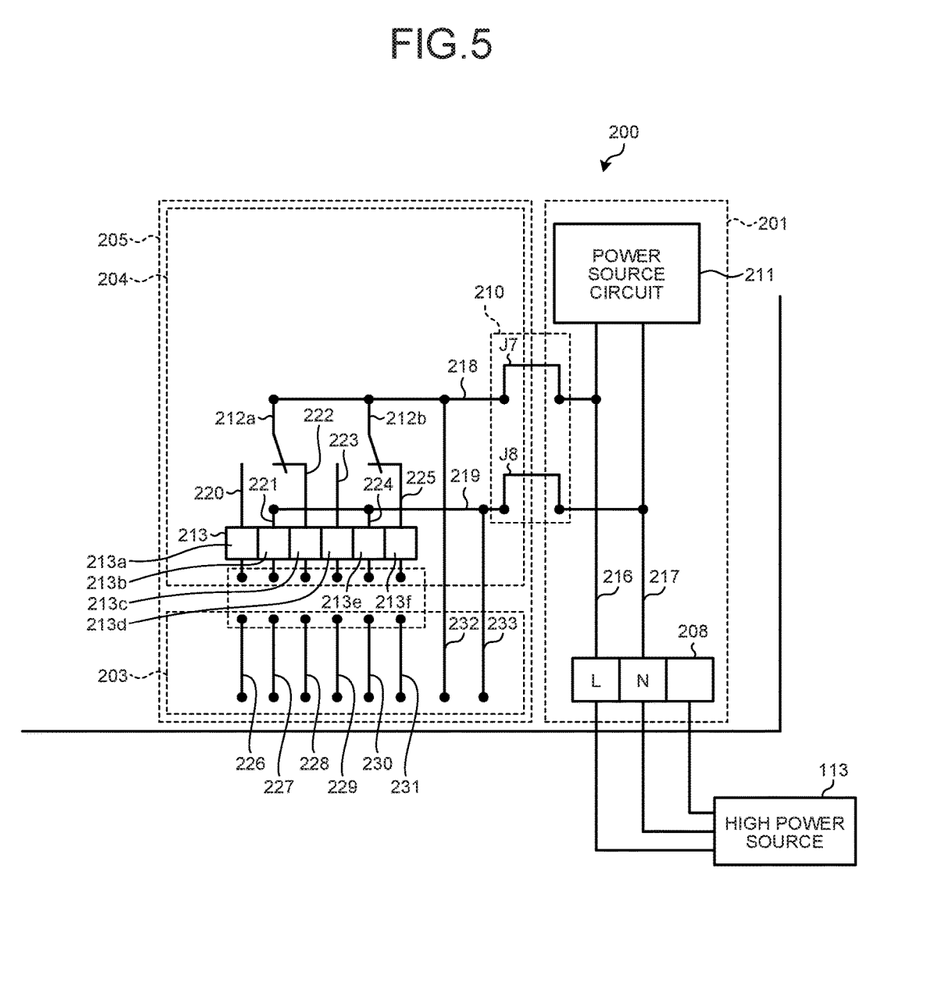
FIG. 5 is a diagram illustrating a configuration of a circuit board for controlling a high voltage motor that uses a printed wiring board according to the first embodiment.

FIG. 5 is a diagram illustrating a configuration of a circuit board for controlling a high voltage motor that uses a printed wiring board according to the first embodiment. On the circuit board 200 for controlling the high voltage motor, the first jumpers J7 and J8 are mounted on the first insulator 210, and the live wiring 216 of the primary circuit 201 is connected to the live wiring 218 of the common circuit 204. Further, the neutral wiring 217 of the primary circuit 201 is connected to the neutral wiring 219 of the common circuit 204.

The second insulator 214, in contrast, does not have the second jumpers J1 to J6 mounted thereon. Therefore, the first forward wiring 226 of the low voltage circuit 203 is separated from the first forward wiring 220 of the common circuit 204. The first return current wiring 227 of the low voltage circuit 203 is separated from the first return current wiring 221 of the common circuit 204. The first reverse wiring 228 of the low voltage circuit 203 is separated from the first reverse wiring 222 of the common circuit 204. The second forward wiring 229 of the low voltage circuit 203 is separated from the second forward wiring 223 of the common circuit 204. The second return current wiring 230 of the low voltage circuit 203 is separated from the second return current wiring 224 of the common circuit 204. The second reverse wiring 231 of the low voltage circuit 203 is separated from the second reverse wiring 225 of the common circuit 204.

The low voltage circuit 203 does not have the connectors 215a and 215b and the terminal block 234 mounted thereon.

The terminal block 213 is mounted on the common circuit 204, and the first forward wiring 220 is connected to a first forward terminal 213a. The first return current wiring 221 is connected to a first return current terminal 213b. The first reverse wiring 222 is connected to a first reverse terminal 213c. The second forward wiring 223 is connected to a second forward terminal 213d. The second return current wiring 224 is connected to a second return current terminal 213e. The second reverse wiring 225 is connected to a second reverse terminal 213f.

The live side of the high voltage supplied from the high power source 113 is supplied from the terminal block 208 to the first relay 212a and the second relay 212b via the live wiring 216, the first jumper J7, and the live wiring 218. The first relay 212a connects the live wiring 218 to the first forward wiring 220 or the first reverse wiring 222. When the first relay 212a connects the live wiring 218 to the first forward wiring 220, the power is supplied to the first forward terminal 213a of the terminal block 213 via the first forward wiring 220. When the first relay 212a connects the live wiring 218 to the first reverse wiring 222, the power is supplied to the first reverse terminal 213c of the terminal block 213 via the first reverse wiring 222. The second relay 212b connects the live wiring 218 to the second forward wiring 223 or the second reverse wiring 225. When the second relay 212b connects the live wiring 218 to the second forward wiring 223, the power is supplied to the second forward terminal 213d of the terminal block 213 via the second forward wiring 223. When the second relay 212b connects the live wiring 218 to the second reverse wiring 225, the power is supplied to the second reverse terminal 213f of the terminal block 213 via the second reverse wiring 225. Additionally, in the first embodiment, the high voltage is 240 V.

The neutral side of the high voltage supplied from the high power source 113 is supplied from the terminal block 208 to the first return current terminal 213b of the terminal block 213 via the neutral wiring 217, the first jumper J8, the neutral wiring 219, and the first return current wiring 221. Further, the neutral side of the high voltage supplied from the high power source 113 is supplied from the terminal block 208 to the second return current terminal 213e of the terminal block 213 via the neutral wiring 217, the first jumper J8, the neutral wiring 219, and the second return current wiring 224.

Because the terminal block 234 is connected to the live wiring 232 and the neutral wiring 233, the live wiring 232 and the neutral wiring 233 are divided part way, and a jumper may be provided at the divided part. By dividing the live wiring 232 and the neutral wiring 233 part way, when the high voltage motor 110 is used, the insulation distance between the live wiring 232 and the neutral wiring 233 can be ensured without mounting the jumpers on the live wiring 232 and the neutral wiring 233.

Figure 6:
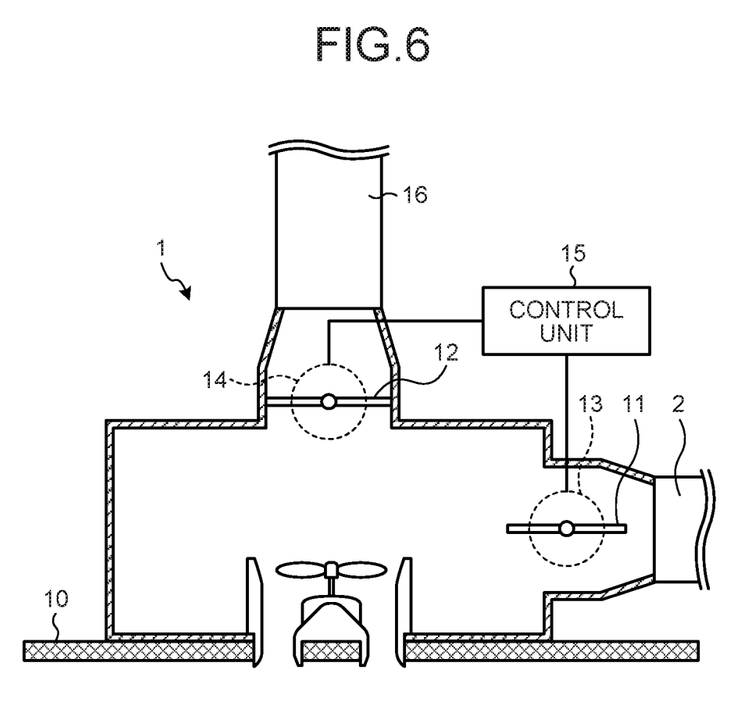
FIG. 6 is a diagram illustrating a configuration of a duct air conditioner using a control unit that uses a printed wiring board according to the first embodiment.

The control unit that uses the circuit board according to the first embodiment can be used as an opening/closing control unit for a duct air conditioner. FIG. 6 is a diagram illustrating a configuration of a duct air conditioner using a control unit that uses the circuit board according to the first embodiment is applied. A duct air conditioner 1 is provided behind a ceiling 10. The duct air conditioner 1 includes a damper 11 for opening/closing a duct 2, a damper motor 13 for driving the damper 11, a damper 12 for opening/closing a duct 16, a damper motor 14 for driving the damper 12, and a control unit 15 for controlling the damper motors 13 and 14. As the damper motors 13 and 14, one of the low voltage motor operated with the low voltage and the high voltage motor operated with the high voltage is used. The control unit 15 uses a common printed wiring board, and the low voltage component or the high voltage component is mounted on the control unit 15 depending on which one of the low voltage motor and the high voltage motor is used as the damper motors 13 and 14. Accordingly, the structure of the control unit 15 can be made suitable for the low voltage or the high voltage.

In this manner, the printed wiring board according to the first embodiment can have a circuit structure for a low voltage by mounting the low voltage component thereon and have a circuit structure for a high voltage by mounting the high voltage component thereon. The circuit for the low voltage and the circuit for the high voltage share the printed wiring board. With this configuration, miniaturization of the substrate can be realized by reducing the component mounting area on a single substrate as well as the realization of reducing manufacturing costs. Further, development costs can be reduced by not designing and manufacturing a plurality of printed wiring boards. The environmental load at a manufacturing stage can be reduced by preventing the increase in the number of assembly processes and components.

Also, the printed wiring board according to the first embodiment can realize insulation between the primary circuit and the common circuit and insulation between the common circuit and the low voltage circuit. Therefore, short circuits can be prevented from occurring and the life of the product can be prolonged.

Second Embodiment

Figure 7:
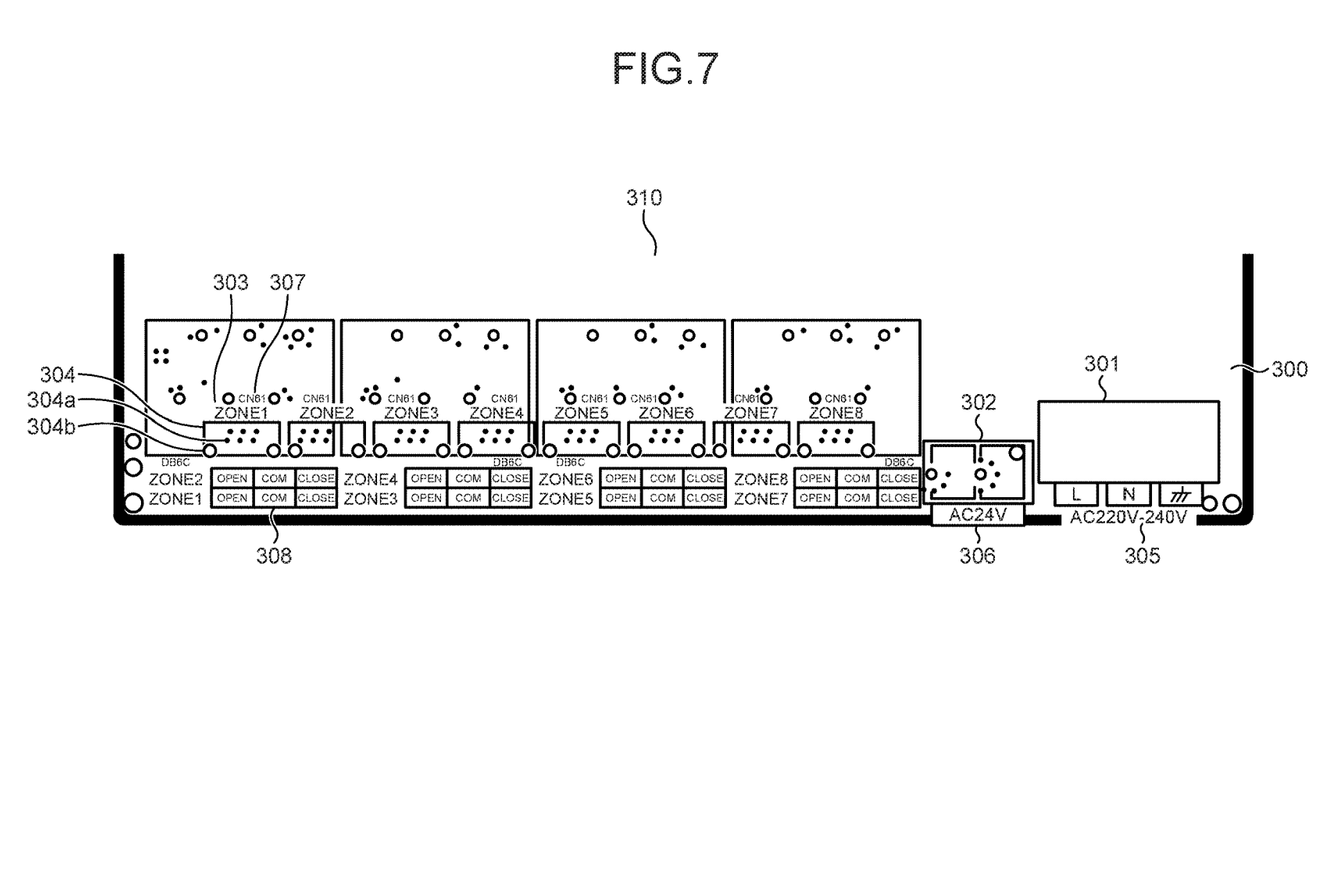
FIG. 7 is a diagram illustrating a configuration of a printed wiring board according to a second embodiment of the present invention.

FIG. 7 is a diagram illustrating a configuration of a printed wiring board according to a second embodiment of the present invention. A surface of a printed wiring board 300 is covered with a silk printing 310. In the second embodiment, the connection destination of a component and component identifying characters are printed on the silk printing 310.

The following are printed on the silk printing 310: a power source terminal block mounting unit 301 on which a terminal block for receiving power supply from a high power source is mounted; a power supply terminal block mounting unit 302 on which a terminal block for receiving power supply from a low power source is mounted; a terminal block mounting unit for a high voltage motor 303 on which a terminal block for connecting the high voltage motor is mounted; and a connector mounting unit for a low voltage motor 304 on which a connector for connecting the low voltage motor is mounted. The power source terminal block mounting unit 301, the power supply terminal block mounting unit 302, the terminal block mounting unit for a high voltage motor 303, and the connector mounting unit for a low voltage motor 304 indicate the connection locations of the components. The connector mounting unit for a low voltage motor 304 is a silk printing for the low voltage component, and the terminal block mounting unit for a high voltage motor 303 is a silk printing for the high voltage component.

The connector mounting unit for a low voltage motor 304 is overlapped with a part of the terminal block mounting unit for a high voltage motor 303. In the silk printing 310, holes 304a and 304b for mounting the connectors for the low voltage motor are formed in a part where the terminal block mounting unit for a high voltage motor 303 is overlapped with the connector mounting unit for a low voltage motor 304.

Power source terminal block information 305 is printed adjacent to the power source terminal block mounting unit 301. Power supply terminal block information 306 is printed adjacent to the power supply terminal block mounting unit 302. Connector information 307 is printed so as to be adjacent to the connector mounting unit for a low voltage motor 304 and so as to be positioned in the terminal block mounting unit for a high voltage motor 303. Terminal block information 308 is printed so as to be adjacent to the terminal block mounting unit for a high voltage motor 303 and so as to be positioned in the connector mounting unit for a low voltage motor 304. The power source terminal block information 305, the power supply terminal block information 306, the connector information 307, and the terminal block information 308 are component identifying characters. The connector information 307 is information on the low voltage component, and the terminal block information 308 is information on the high voltage component.

Figure 8:
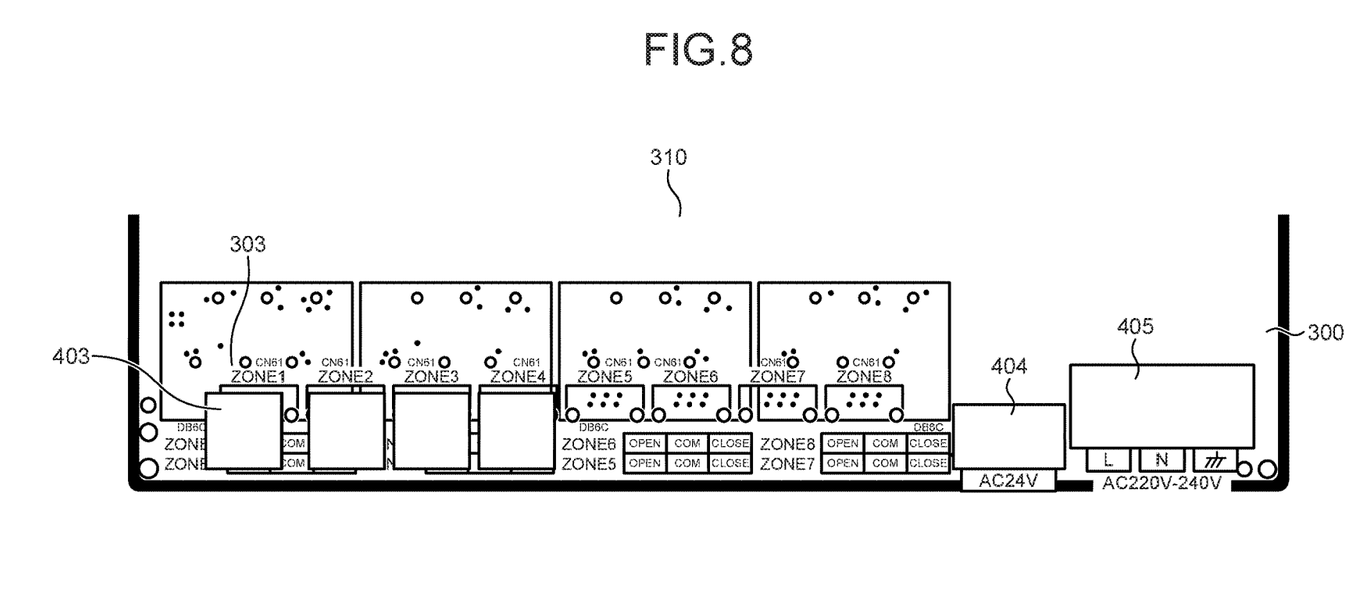
FIG. 8 is a diagram illustrating a state in which a printed wiring board according to the second embodiment is used as a circuit board for controlling a low voltage motor.

FIG. 8 is a diagram illustrating a state in which a printed wiring board according to the second embodiment is used as a circuit board for controlling the low voltage motor. When a control board for the low voltage motor is constructed from a printed wiring board 300, a power source terminal block 405 is mounted on the power source terminal block mounting unit 301. Further, a power supply terminal block 404 is mounted on the power supply terminal block mounting unit 302, and a connector 403 for the low voltage motor is mounted on the connector mounting unit for a low voltage motor 304. The connector 403 for the low voltage motor is mounted so as to protrude from a part where the connector mounting unit for a low voltage motor 304 has been printed and cover the terminal block information 308. The connector 403 for the low voltage motor is a modular connector of RJ12 standard in the second embodiment.

Figure 9:
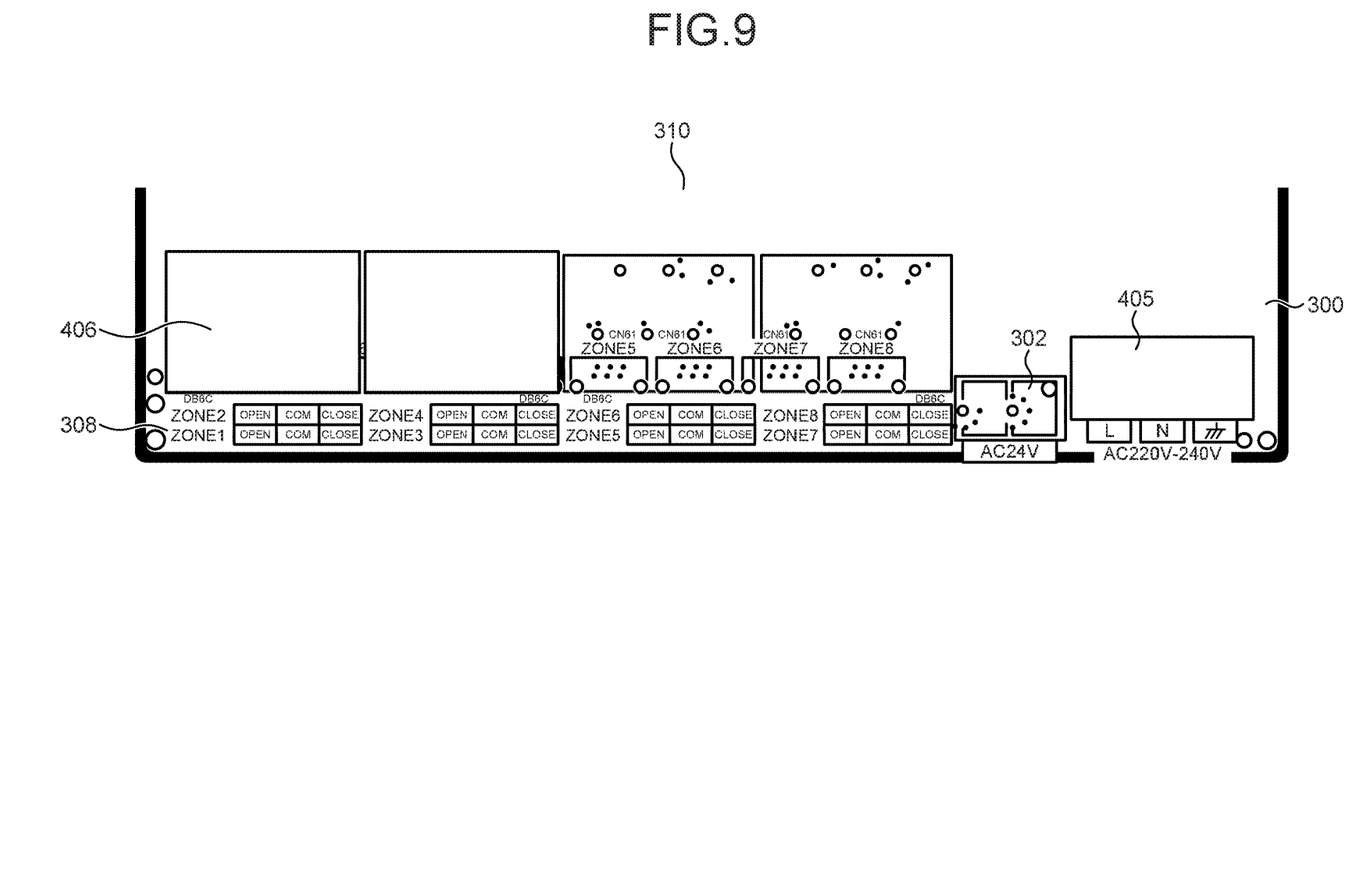
FIG. 9 is a diagram illustrating a state in which the printed wiring board according to the second embodiment is used as a circuit board for controlling a high voltage motor.

FIG. 9 is a diagram illustrating a state in which the printed wiring board according to the second embodiment is used as a circuit board for controlling a high voltage motor. When a motor control board for the high voltage motor is constructed from the printed wiring board 300, the power source terminal block 405 is mounted on the power source terminal block mounting unit 301, and a terminal block 406 for a high voltage terminal is mounted on the terminal block mounting unit for a high voltage motor 303.

Normally, the connector for the low voltage and the terminal block for the high voltage are not disposed so as to be close to each other due to insulation distance constraints. In the second embodiment, similar to the first embodiment, a first insulator is provided between the primary circuit and the common circuit, and a second insulator is provided between the common circuit and the low voltage circuit. Thus, the connector mounting unit for a low voltage motor 304 is partially overlapped with the terminal block mounting unit for a high voltage motor 303, and the terminal block and the connector can be exclusively provided.

When the connector 403 is mounted on the connector mounting unit for a low voltage motor 304, the terminal block information 308 that is information on the high voltage component printed on the silk printing 310 is covered by the connector 403. Further, when the terminal block 406 is mounted on the terminal block mounting unit for a high voltage motor 303, the connector information 307 that is information on the low voltage component printed on the silk printing 310 is covered by the terminal block 406. Therefore, in both cases, i.e., a case where the connector 403 is mounted and a case where the terminal block 406 is mounted, information on the mounted component can be visually recognized, and a case can be avoided where the information on the component that is not mounted is inadvertently read.

When the silk printing 310 cannot be used as a common silk board in a case where the connector 403 is mounted and also in a case where the terminal block 406 is mounted, it is necessary to use a different silk printing for each substrate or to distinguish the silk printings for each substrate by putting stickers on them. Accordingly, the manufacturing costs increases. However, in the second embodiment, because the silk printing 310 can be used as a common silk board in a case where the connector 403 is mounted and also in a case where the terminal block 406 is mounted, the manufacturing costs can be prevented from being raised.

The structures illustrated in the above embodiments illustrate exemplary contents of the present invention and can be combined with other known techniques. Further, the structures illustrated in the embodiments can be partially omitted and changed without departing from the scope of the present invention.

The invention claimed is:

1. A printed wiring board comprising:
   a pattern for a primary circuit that receives a power supply with a high voltage from a high power source;
   a pattern for a component mounting circuit, which includes a low voltage circuit and a common circuit;
   a pattern for the low voltage circuit that receives a power supply of a low voltage lower than the high voltage;
   a pattern for the common circuit that is used in a case where a high voltage component used for the high voltage is provided and also in a case where a low voltage component used on the low voltage is provided;

a first insulator that insulates the pattern for the primary circuit from the pattern for the common circuit; and a second insulator that insulates the pattern for the common circuit from the pattern for the low voltage circuit, wherein the low voltage circuit is used in a case where the low voltage component is mounted thereon, and the common circuit is used when either one of the low voltage component and the high voltage component is mounted thereon.

2. A circuit board that is provided with the printed wiring board according to claim 1, comprising:

a first jumper that connects the pattern for the primary circuit to the pattern for the common circuit, wherein the high voltage component is provided on the common circuit.

3. The circuit board according to claim 2, wherein the high voltage component is a terminal block for connecting to a high voltage motor used on the high voltage, and the low voltage component is a connector for connecting to a low voltage motor used on the low voltage.

4. A control unit that is provided with the circuit board according to claim 3 and that controls opening/closing of a duct of a duct air conditioner, wherein the high voltage motor and the low voltage motor are damper motors that drive dampers for opening/closing the ducts.

5. The circuit board according to claim 2, wherein a region on which the high voltage component is provided partially overlaps with a region on which the low voltage component is provided.

6. The circuit board according to claim 5, comprising:

a silk printing that has information on the high voltage component and the low voltage component, wherein the information on the low voltage component is printed so as to be adjacent to the region on which the low voltage component is provided and so as to be positioned within the region on which the high voltage component is provided, and the information on the high voltage component is printed so as to be adjacent to the region on which the high voltage component is provided and so as to be positioned within the region on which the low voltage component is provided.

7. A circuit board that is provided with the printed wiring board according to claim 1, comprising:

a second jumper that connects the pattern for the common circuit to the pattern for the low voltage circuit, wherein the low voltage component and a power supply terminal block for receiving the power supply of the low voltage are provided on the low voltage circuit.

8. The circuit board according to claim 7, wherein the second jumper is a chip-type jumper, and a distance obtained by adding a creepage distance of the chip-type jumper on a live side of the low voltage component to a creepage distance of the chip-type jumper on a neutral side of the low voltage component is equal to or larger than an insulation distance for the low voltage.

9. The circuit board according to claim 7, wherein the high voltage component is a terminal block for connecting to a high voltage motor used on the high voltage, and the low voltage component is a connector for connecting to a low voltage motor used on the low voltage.

10. The circuit board according to claim 7, wherein a region on which the high voltage component is provided partially overlaps with a region on which the low voltage component is provided.

* * * * *